(12) United States Patent
Piedra (10) Patent No.: US 12,007,578 B2
(45) Date of Patent: Jun. 11, 2024

(54) LASER POINTER ACCESSORY

(71) Applicant: Harry Piedra, Miami, FL (US)

(72) Inventor: Harry Piedra, Miami, FL (US)

( * ) Notice: Subject to any disclaimer, the term of this patent is extended or adjusted under 35 U.S.C. 154(b) by 0 days.

(21) Appl. No.: 18/087,000

(22) Filed: Dec. 22, 2022

(65) Prior Publication Data

US 2023/0194886 A1 Jun. 22, 2023

Related U.S. Application Data

(60) Provisional application No. 63/265,840, filed on Dec. 22, 2021.

(51) Int. Cl.
*G02B 27/20* (2006.01)
*H05K 5/02* (2006.01)

(52) U.S. Cl.
CPC ........... *G02B 27/20* (2013.01); *H05K 5/0204* (2013.01)

(58) Field of Classification Search
CPC ............................. G02B 27/20; H05K 5/0204
See application file for complete search history.

(56) References Cited

U.S. PATENT DOCUMENTS

| | | | |
|---|---|---|---|
| 5,938,315 A * | 8/1999 | Chao ................ | G02B 27/20 353/42 |
| 2017/0130913 A1* | 5/2017 | Chen ................ | G02B 27/20 |
| 2023/0088078 A1* | 3/2023 | Cross ............... | H04M 1/0281 455/556.1 |

FOREIGN PATENT DOCUMENTS

| | | |
|---|---|---|
| CN | 202503574 U | 10/2012 |
| CN | 211266925 U | 8/2020 |
| CN | 112202943 A | 8/2021 |
| DE | 202012011580 U1 | 1/2013 |
| KR | 20000030880 A | 5/2000 |
| KR | 20000063106 A | 6/2000 |
| KR | 20000063112 A | 6/2000 |
| KR | 20040026806 A | 1/2004 |
| KR | 200362157 Y1 | 9/2004 |
| KR | 200409468 Y1 | 2/2006 |
| KR | 20070019089 A | 2/2007 |
| KR | 20080112460 A | 12/2008 |
| KR | 20110092910 A | 8/2011 |
| KR | 101301293 B1 | 8/2013 |
| KR | 20150021412 A | 1/2015 |
| TW | M502272 U | 1/2015 |

OTHER PUBLICATIONS

Julian Seifert, Andreas Bayer, Enrico Rukzioi, PointerPhone: Using Mobile Phones for Direct Pointing Interactions with Remote Displays, Hal open science, 14th International Conference on Human-Computer Interaction (INTERACT), Sep. 2013, Cape Town, South Africa. pp. 18-35, 10.1007/978-3-642-40477-1_2. hal-01504904.
IPin Laser Presenter for iPhone, https://www.ipinlaser.com/ipin-laser-presenter-for-iphone.

* cited by examiner

*Primary Examiner* — Anne M Hines
(74) *Attorney, Agent, or Firm* — Javier Sobrado; The Brickell IP Group, PLLC (57) ABSTRACT

A laser pointer accessory having a housing and a laser diode assembly including an actuation button. The housing including a top and bottom surface, and an internal chamber such that the laser diode assembly is disposed within the internal chamber of the housing. The top surface of the housing including an actuator capable of being depressed such that it engages the actuation button in order to activate the laser diode assembly.

20 Claims, 14 Drawing Sheets

FIG. 20

LASER POINTER ACCESSORY

FIELD

The present invention relates to a laser pointer accessory, particularly to a laser pointer accessory for a keychain or mobile device.

BACKGROUND OF THE INVENTION

Laser pointers are commonly known to be used as aids in highlighting objects, features, points of interest, indicia, equipment that is difficult to otherwise indicate with a finger or pointer stick, for example. A laser pointer is typically a small handheld device that uses a power source (usually batteries) and diode laser to produce a coherent beam of monochromatic light. Laser pointers highlight the point of interest by using a strongly colored beam of light However, current laser pointers can be cumbersome, lack ergonomically designed features, easy to damage or lose, or expensive to manufacture. Additionally, laser pointers are not easily accessible or easily incorporated with mobile devices in a way that can allow a user to quickly use, wherein the laser pointer accessory will not accidentally turned on.

Therefore, there remains a need for an improved laser pointer accessory.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In certain embodiments, a laser pointer accessory may include a housing and a laser diode assembly including an actuation button. The housing may include a top and bottom surface, and an internal chamber such that the laser diode assembly is disposed within the internal chamber of the housing. The top surface of the housing may include an actuator capable of being depressed such that it engages the actuation button in order to activate the laser diode assembly.

In certain embodiments, a case for a smartphone ay include a protective housing capable of receiving and securing a smartphone; a base housing integrally formed with the protective housing, an upper housing comprising and a laser diode assembly. The upper housing may have a top surface such that the upper housing and the base housing form an internal chamber. The laser diode assembly may be disposed within the internal chamber of the housing and may include an actuation button. The top surface of the housing may include an actuator capable of being depressed such that it engages the actuation button in order to activate the laser diode assembly.

In certain embodiments, a case for a smartphone may include a protective housing capable of receiving and securing a smartphone, a base housing integrally formed with the protective housing; and a laser pointer accessory. The laser pointer accessory may include a housing having a top and bottom surface, and an internal chamber, and a laser diode assembly disposed within the internal chamber of the housing. The laser diode assembly may include an actuation button. The top surface of the housing may include an actuator capable of being depressed such that it engages the actuation button in order to activate the laser diode assembly.

BRIEF DESCRIPTION OF THE DRAWINGS

The drawings set forth exemplary embodiments of the disclosed concepts, and are not intended to be limiting in any way.

DETAILED DESCRIPTION OF THE PREFERRED EMBODIMENT

The following detailed description and the appended drawings describe and illustrate exemplary embodiments solely for the purpose of enabling one of ordinary skill in the relevant art to make and use the invention. As such, the detailed description and illustration of these embodiments are purely exemplary in nature and are in no way intended to limit the scope of the invention, or its protection, in any manner. It should also be understood that the drawings are not to scale and in certain instances details have been omitted, which are not necessary for an understanding of the present invention, such as conventional details of fabrication and assembly.

The drawings depict the laser pointer accessory being disposed on various smartphones and/or smartphone cases. It should be understood by persons of ordinary skill in the art that the disclosed concepts may be disposed on and used with any device or device casing that may be used as a pointer, including but not limited to traditional pointing devices, such as warehouse scanners, inventory scanners, walking sticks, canes, wallets, helmets, goggles, and any other hand-held device.

In certain embodiments, a laser pointer accessory may include a housing and a laser diode assembly including an actuation button. The housing may include a top and bottom surface, and an internal chamber such that the laser diode assembly is disposed within the internal chamber of the housing. The top surface of the housing may include an actuator capable of being depressed such that it engages the actuation button in order to activate the laser diode assembly.

In certain embodiments, the top surface of the housing may include a recessed portion, and the actuator may be disposed within the recessed portion such that the actuator is recessed relative to a plane defined by the top surface of the housing. In certain such embodiments, the actuator may include a cantilever. In certain such embodiments, the cantilever may include a cantilever bud. In certain such embodiments, the cantilever may include a cantilever dimple. In certain such embodiments, the cantilever bud may project from a top surface of the cantilever, but remains beneath the plane defined by the top surface of the housing. In certain such embodiments, cantilever cutouts may be provided around the cantilever. In certain such embodiments, a membrane capable of preventing liquids from entering the internal chamber of the housing may disposed at the cantilever and cantilever cutouts.

Certain embodiments may further include a coupling device capable of detachably connecting the laser pointer assembly to a smartphone device. In certain such embodiments, the lower surface of the housing is provided with a recess, and the coupling device is disposed within the recess. In certain such embodiments, the coupling device may be an adhesive. In certain such embodiments, the coupling device may be a hook and loop system. In certain such embodiments, the coupling device may be a command strip.

Certain embodiments may include a wireless communication transmitter. In certain such embodiments, the wireless communication signal may be capable of receiving an input signal. In certain such embodiments the input signal may direct the laser diode assembly to change the color, pattern or shape of a laser output. Certain such embodiments, may further include one or more input devices. In certain such embodiments a first input device may be capable of generating a signal to be transmitted through the wireless communication transmitter. In certain such embodiments the first input device may be a button capable of generating a mouse button click signal. In certain such embodiments the button click signal may be a left button click signal. In certain such embodiments the button click signal may be a right button click signal. In certain such embodiments the button click signal may be a middle button click signal. In certain such embodiments the first input may be a scroll wheel, spherical mouse input, or multidirectional mouse bud. In certain such embodiments the first input device may be a microphone capable of capturing sound and generating a sound signal. In certain such embodiments a second input device may be an activation button that can activate the microphone.

In certain embodiments, the housing may include an upper housing and a lower housing. In certain embodiments, the laser diode assembly may include a battery and the upper housing comprises a battery securing rib such that the battery securing rib secures the battery in place within the internal chamber of the housing. In certain embodiments the battery may be rechargeable. In certain embodiments the battery may be replaceable. In certain such embodiments, a door may be provided to give a user access to the battery.

In certain embodiments, the top surface may include a display surface. In certain embodiments, the housing further may include a key ring feature. In certain embodiments, the housing may be capable of engaging with and being secured within a base housing. In certain embodiments the base housing may be capable of being removably attached to a device or device case or cover. In certain embodiments the base housing may be integrated with or permanently attached to a device or device case or cover. In certain embodiments, the base may be housing capable of connecting to a smartphone or smartphone case or cover. In certain such embodiments housing of the laser pointer accessory may be capable of engaging with and being secured within a base housing.

In certain embodiments, a case for a smartphone ay include a protective housing capable of receiving and securing a smartphone; a base housing integrally formed with the protective housing, an upper housing comprising and a laser diode assembly. The upper housing may have a top surface such that the upper housing and the base housing form an internal chamber. The laser diode assembly may be disposed within the internal chamber of the housing and may include an actuation button. The top surface of the housing may include an actuator capable of being depressed such that it engages the actuation button in order to activate the laser diode assembly.

In certain embodiments, a case for a smartphone may include a protective housing capable of receiving and securing a smartphone, a base housing integrally formed with the protective housing; and a laser pointer accessory. The laser pointer accessory may include a housing having a top and bottom surface, and an internal chamber, and a laser diode assembly disposed within the internal chamber of the housing. The laser diode assembly may include an actuation button. The top surface of the housing may include an actuator capable of being depressed such that it engages the actuation button in order to activate the laser diode assembly.

FIGS. 1-4 illustrate a laser pointer accessory assembly 10 according to an embodiment of the present disclosure. The laser pointer accessory assembly 10 may include an upper housing 100 and a lower housing 102 coupled to the upper housing 100 and enclosing a chamber. In the embodiment illustrated, the upper housing 100 and the lower housing 102 have a substantially egg-shape or oblong cross-sectional shape. Although, the laser pointer accessory assembly 10 can have a rectangular or square cross-sectional shape, wherein the laser pointer accessory assembly 10 can an overall substantially cuboid or rectangular cuboid shape. However, it should be understood, the laser pointer accessory assembly 10 can have any suitable shape as desired. The housing 100, 102 may be made of metal, plastic, fiberglass, or any other suitable material known in the art or to be developed.

The upper housing 100 may include a retaining feature or key ring feature 104 extending outwardly from a first end of the laser pointer accessory assembly 10. The key ring feature 104 may include a hole 106, 110 formed there through for receiving a key ring, claps, or other structure directly or indirectly coupling the laser pointer accessory assembly 10 to another device such as a key ring, necklace, chance, etc. The key ring feature 104 is shown as extending both the from upper housing 100 and the lower housing 102 wherein a first portion 104 of the key ring feature 104 extends from the upper housing 100 and a second portion 108 of the key ring feature 104 extend from the lower housing 102 to engage with the first portion of the key ring feature 104. Persons of skill in the art will recognize that the disclosed concepts can be implemented to have a key ring feature 104 that extends from only the upper housing 100 or only the lower housing 102. Alternatively, the keyring feature may excluded from certain implementations of the disclosed concepts. They key ring feature 104 may be made from the same materials as the housing or from any other suitable material.

A top main surface of the upper housing or logo surface 112 may be configured for receiving indicia thereon, such as a sticker or engraving for promotional or aesthetic purposes. A laser diode base 114 may be disposed opposite the first end of the accessory assembly 10, as shown, or in any other suitable relationship to same. The top main surface 112 may include a cantilever 116 within cantilever cutout 118, and cantilever recess 120, a cantilever bud or dimple 122. The end of the cantilever 116 may be depressed to activate the laser diode 114. The cantilever recess 120 may serve to protect the cantilever from accidental engagement when the laser pointer accessory is not intentionally being activated. The cantilever bud or dimple 122 may be provided to give a user tactile feedback regarding the location of the end of the cantilever 116. An elastic membrane or other suitable device or sealant may be provided on or beneath the cantilever 116 and cantilever cutouts 118 in order to protect the internal components of the laser pointer accessory 10 from the intrusion of liquids, such as water.

The laser diode base 114 may include a chamber 124 having a window. The chamber 124 may house include a laser diode lens of a laser diode assembly 170 (Se FIG. 11), which may be positioned within the window of the chamber such that the lens is exposed through window formed at the laser diode base 114. When the laser diode is activated, laser light 128 may be transmitted from the laser diode assembly 170 through the laser diode lens 126.

Figure 1:
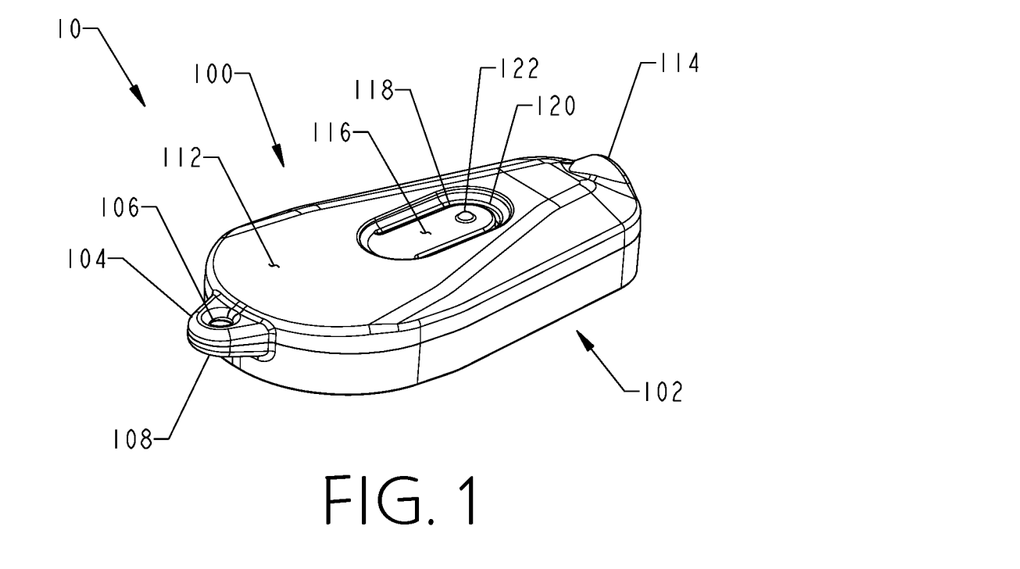
FIG. 1 illustrates a top, rear perspective view of a laser pointer accessory according to an embodiment of the disclosure.
Figure 2:
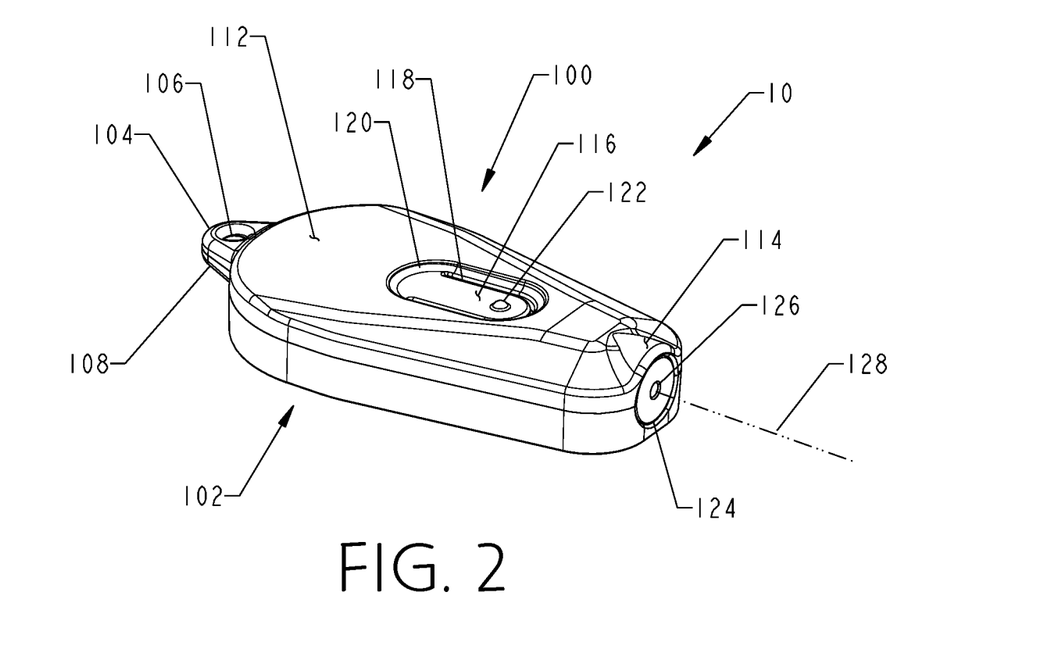
FIG. 2 illustrates a top perspective view of the laser pointer accessory of FIG. 1.
Figure 3:
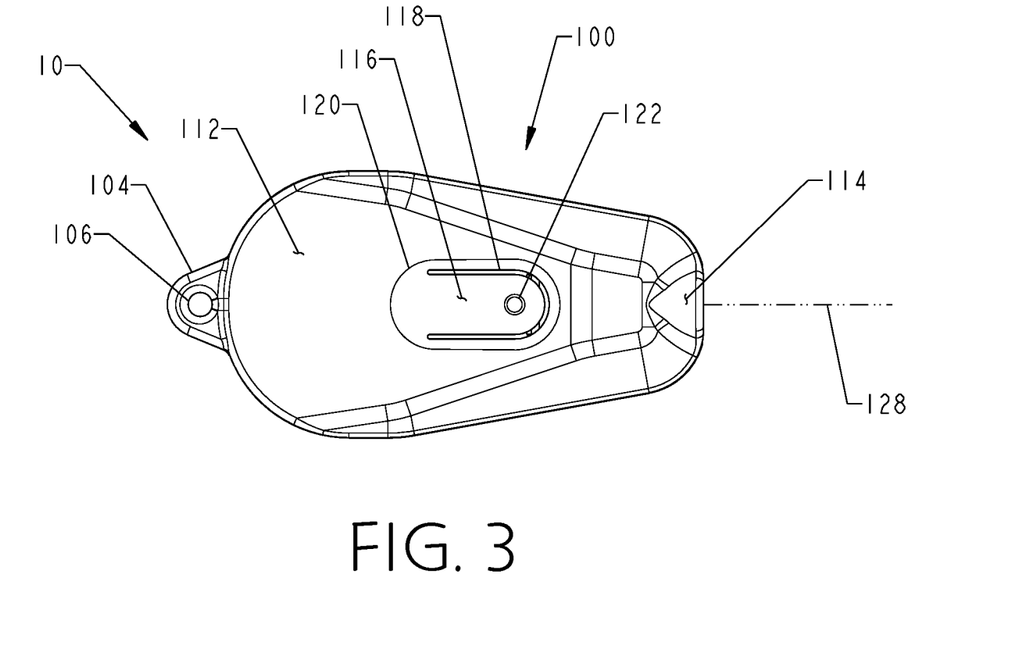
FIG. 3 illustrates a top view of the laser pointer accessory of FIG. 1.
Figure 4:
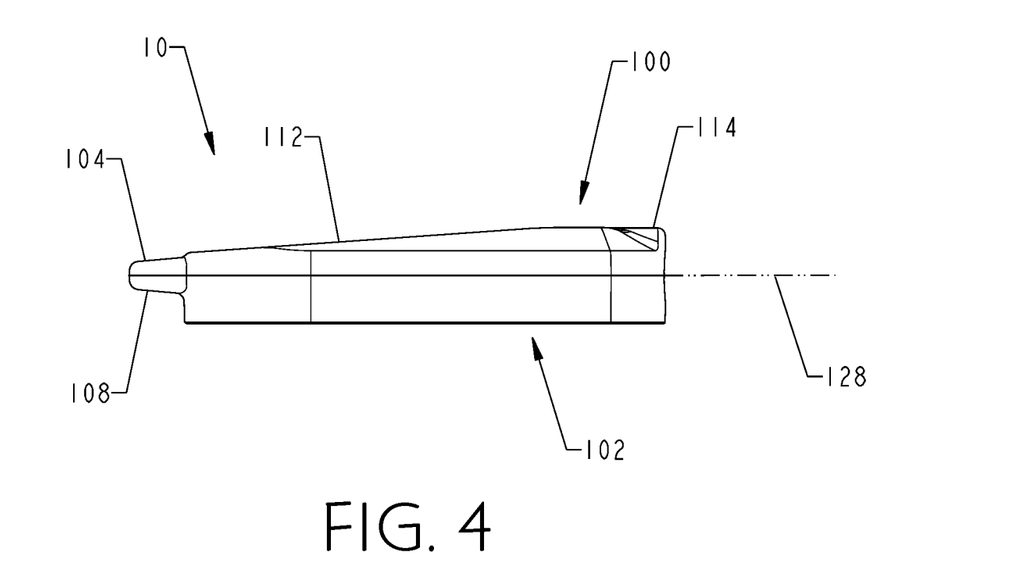
FIG. 4 illustrates a left side view of the laser pointer accessory of FIG. 1.
Figure 5:
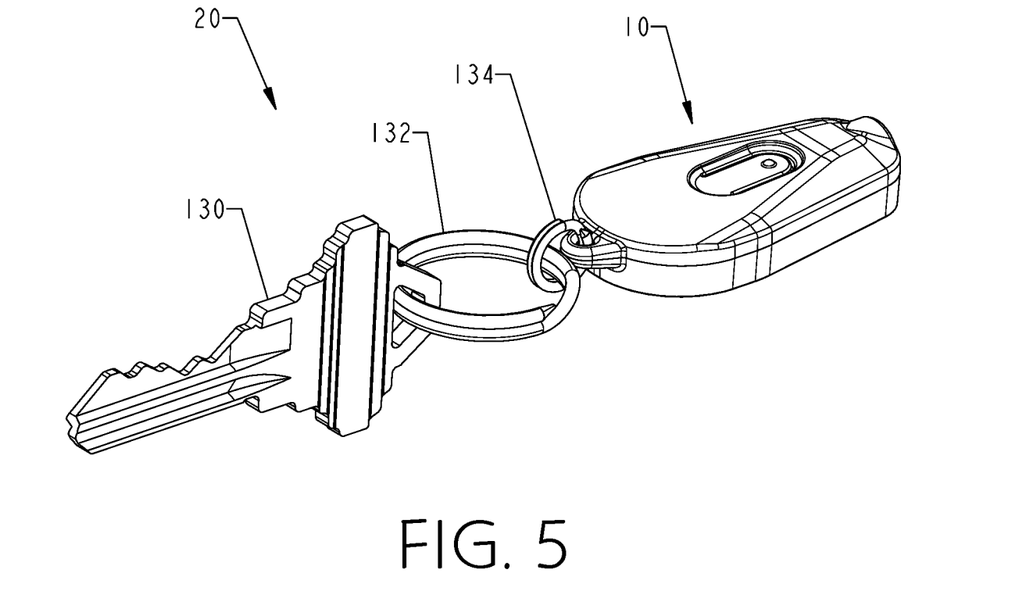
FIG. 5 illustrates a top, rear perspective view of the laser pointer accessory of FIG. 1 coupled to a key ring.
Figure 6:
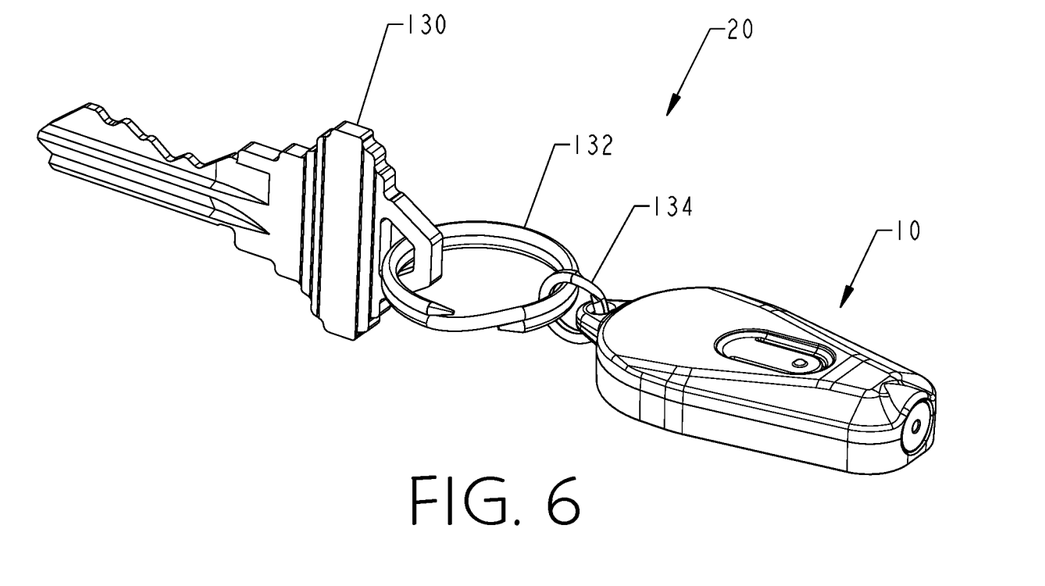
FIG. 6 illustrates a top, front perspective view of the laser pointer accessory coupled to the key ring of FIG. 5.
Figure 7:
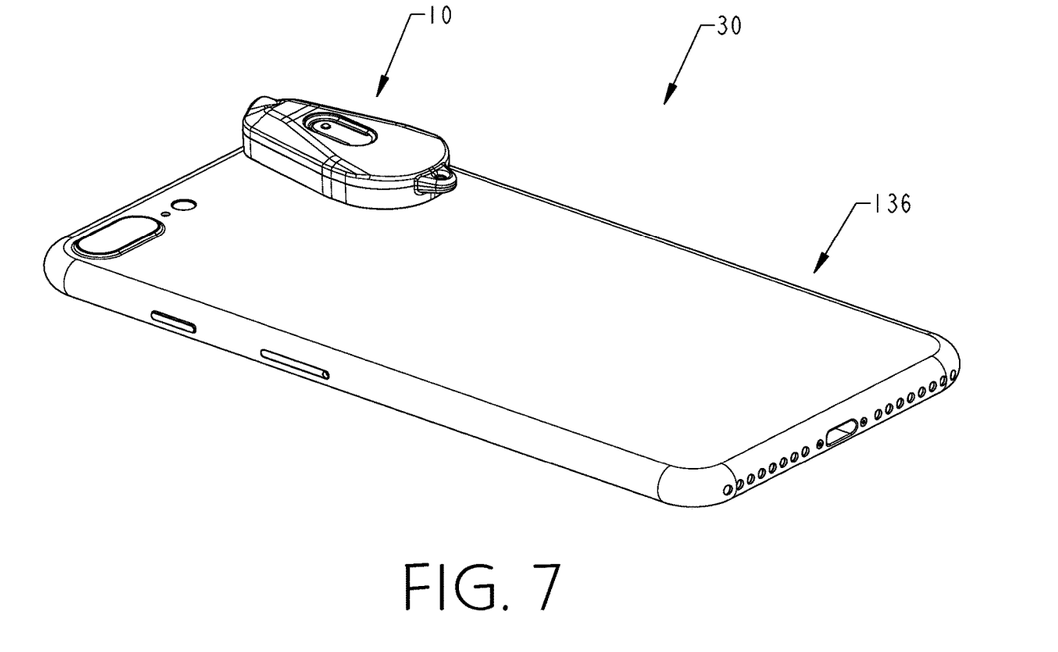
FIGS. 7-10 are top perspective views of the laser pointer accessory of FIG. 1 disposed on various types of mobile devices.
Figure 8:
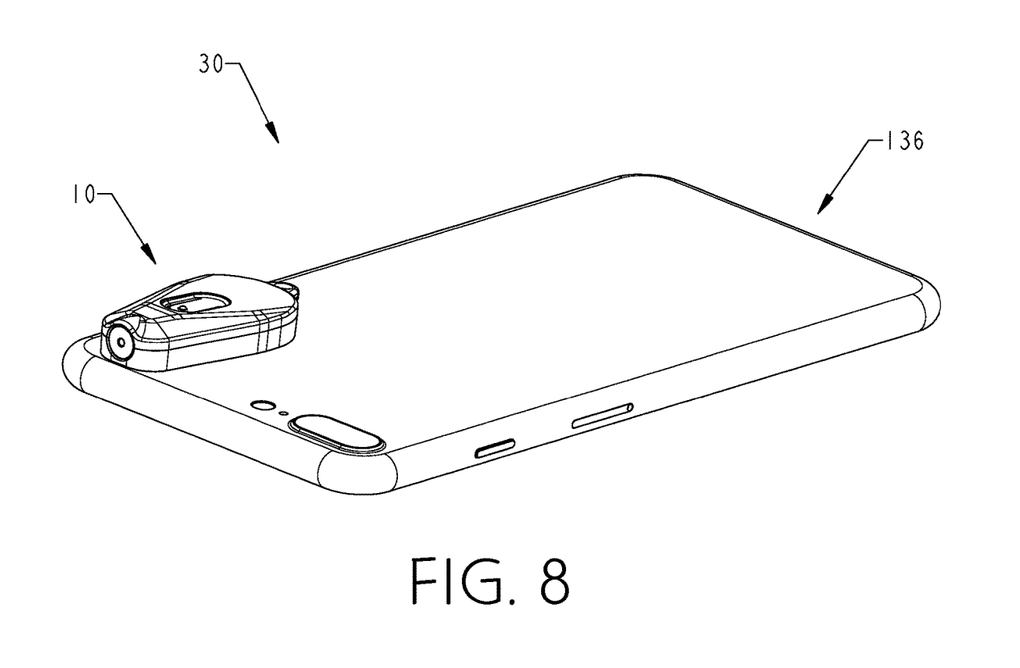
Figure 9:
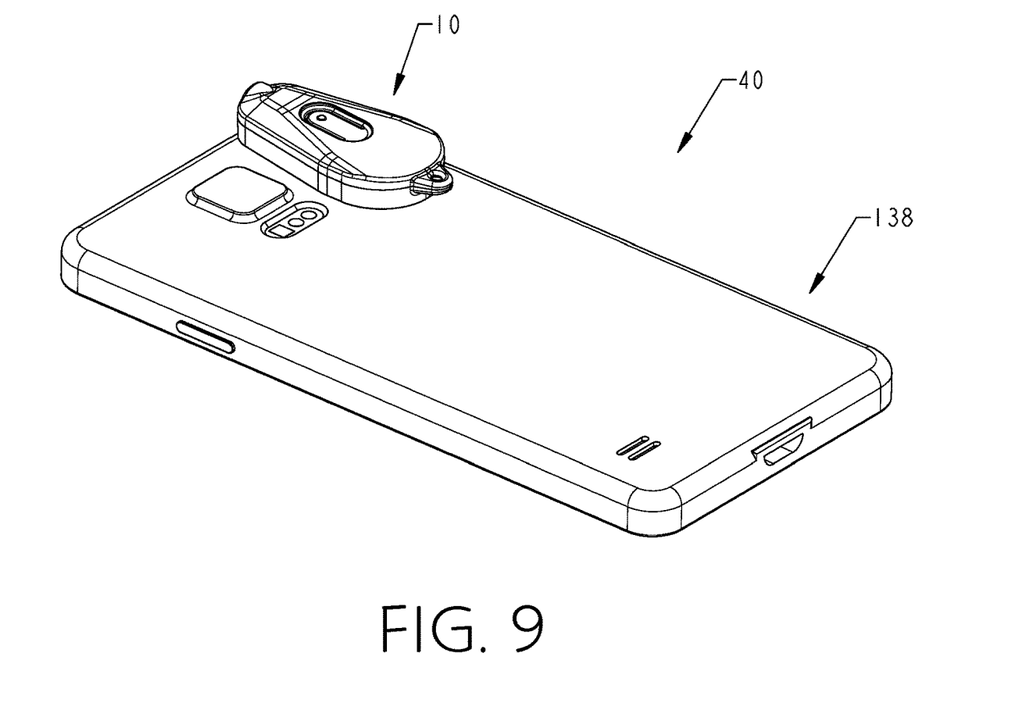
Figure 10:
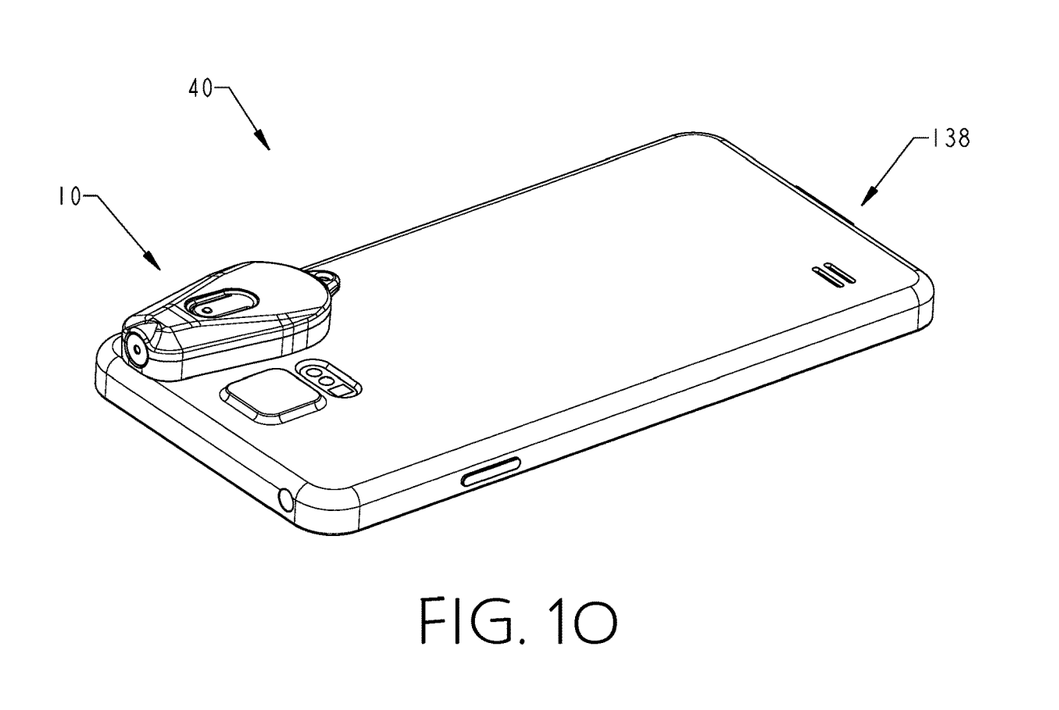

As shown in FIGS. 5-6, the accessory assembly 10 is shown coupled to a key 130 via a primary keyring 132 and a secondary key ring 134. Embodiments having a key ring feature may be used with one or more key rings, as desired or without any key rings. Collectively, the accessory assembly 10, key 130, and keyrings 132, 134 will be referred to as the key-ring laser pointer accessory assembly 20.

FIGS. 7-10 illustrated the accessory assembly 10 formed on various configurations of a smart phone 136, 138. It is understood other smart devices such as tablet, computers, computer accessories and input devices, such as a mouse, or other now known or later developed can include the accessory assembly 10. The accessory assembly 10 can be integrally formed or separately formed and coupled to the smart phone 136, 138, or to a smartphone cover 204, as desired. The accessory assembly 10 can be coupled to the smart phone 136, 138 by a coupling device 140 such as an adhesive tape, hook and loops system, command strip or similar type coupling device. Persons of skill in the art will recognize that any suitable coupling device 140 now known or to be developed may be used, including but not limited to mechanical, magnetic, form-fitting, and/or adhesive type coupling devices.

Figure 11:
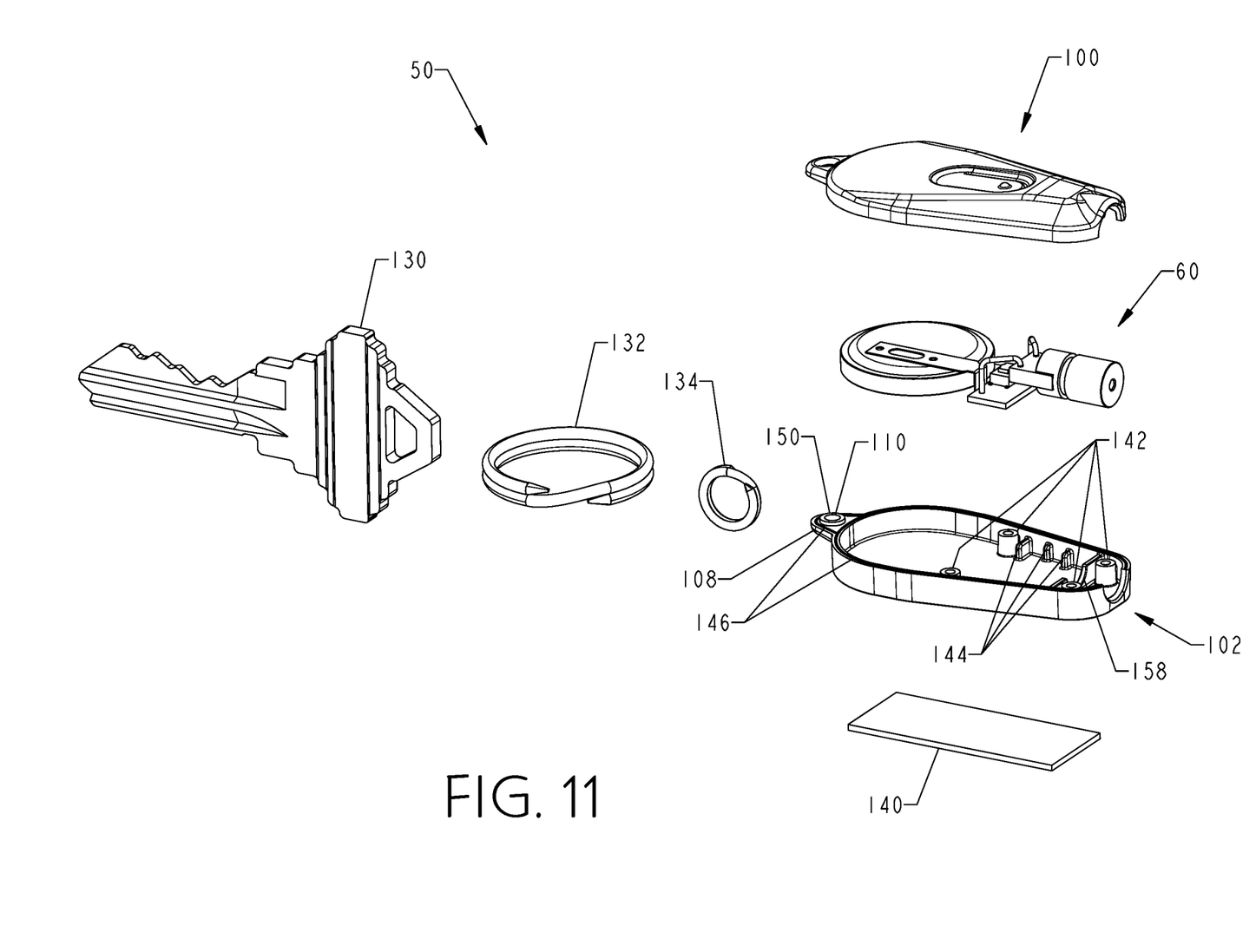
FIG. 11 illustrates partially exploded view of the laser pointer accessory coupled to the key ring of FIG. 5.
Figure 12:
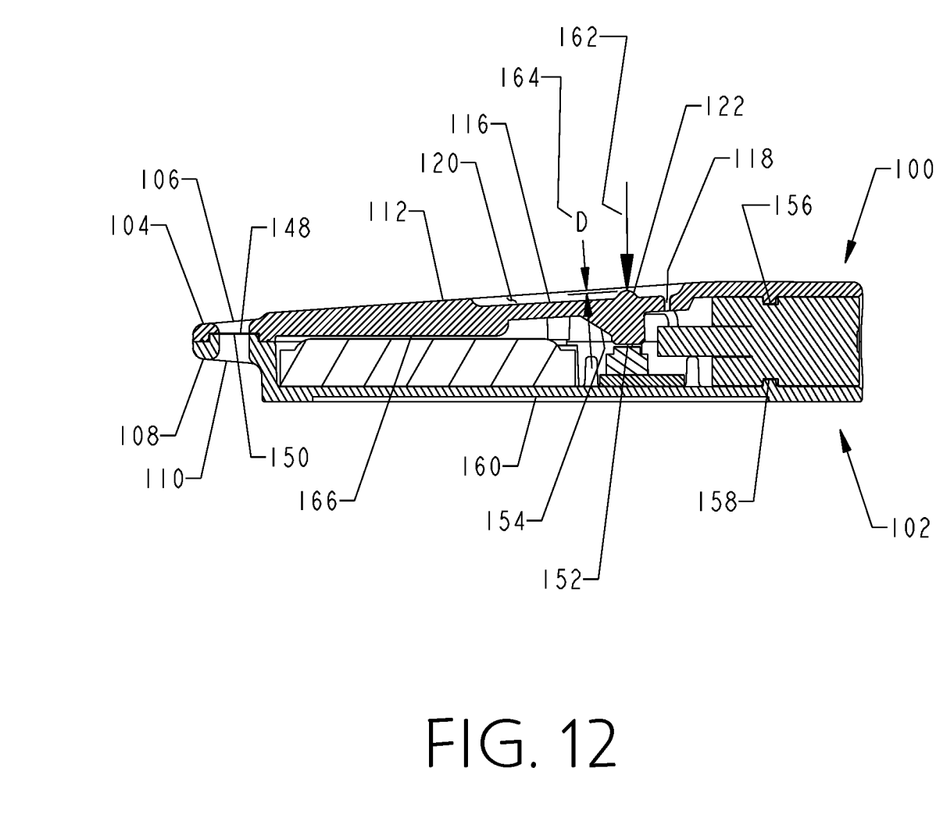
FIG. 12 illustrates a left side cross-sectional view of the laser pointer accessory of FIG. 1.

FIGS. 11-12 are an exploded view of the key-ring laser pointer accessory assembly 20 and a cross-sectional view of the accessory assembly, respectively, to illustrate exemplary internal components of the laser pointer accessory assembly 10 such as locating bosses/holes 142, circuit board locating ribs 144, ultrasonic welding energy director features 146, keyring feature locating recess 148, key ring feature locating boss 150, actuator 152, an actuator strengthening rib, a laser diode body capturing rib 156 of the upper housing 100, a laser diode body capturing rib 158 of the lower housing 102. The bottom surface of the lower housing may preferably long and flat to allow the connection of a coupling device. A recess 160 may be formed in the lower surface of the lower housing 102 for receiving the coupling device 140.

In application a force, shown by arrow 162, may be applied to the cantilever 116 to actuate a tactile button 154. The bud or dimple 122 may be disposed below the plane of the top main surface 112 at a distance D to militate against accidental actuations of the laser diode. A battery securing rib 166 may be formed on an inner surface of the upper housing 100 to maintain a battery 176 securely in position within the laser diode assembly 170 (described in more detail herein below).

Figure 13:
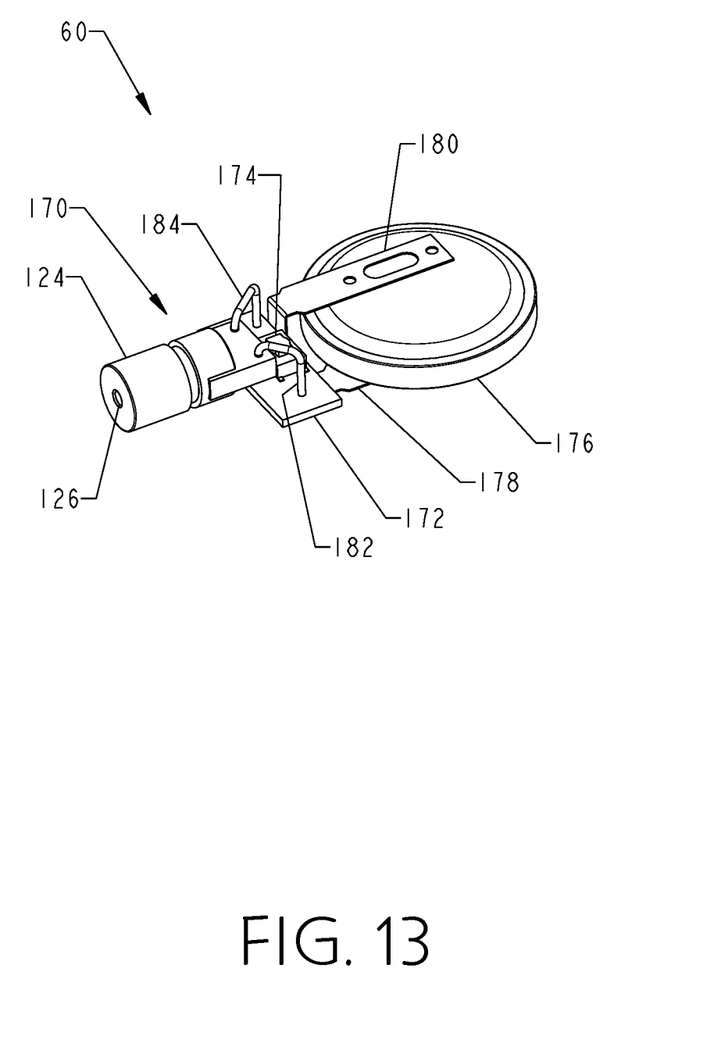
FIG. 13 illustrates a top perspective view of a laser diode assembly of the laser pointer accessory of FIG. 11.

In FIG. 13, a circuit board assembly 60 of a laser diode assembly 170 is shown which may include a printed circuit board (PCB) 172, a tactile button 174, a battery 176, a positive battery connection tab 178, a negative battery connection tab, a laser diode anode wire 182, and a laser diode cathode wire 184. The circuit board assembly 60 may be received in the chamber 124 as shown in FIG. 12. The circuit board assembly 60 can include other features commonly associated with PCB assemblies as desired. The battery 176 may be replaceable or rechargeable, by induction charging as discussed below with respect to FIG. 19 or otherwise, or by traditional recharging means. Where the battery is replaceable, the laser pointer accessory 10 may be provided with a door (not shown), or the connections between the upper housing 100 and lower housing 102 may be disengaged an reengaged (for example if the two housings 100, 102 are connected via screws), such that the old battery can be removed and a new battery (or recharged battery) can be put into the device.

Figure 14:
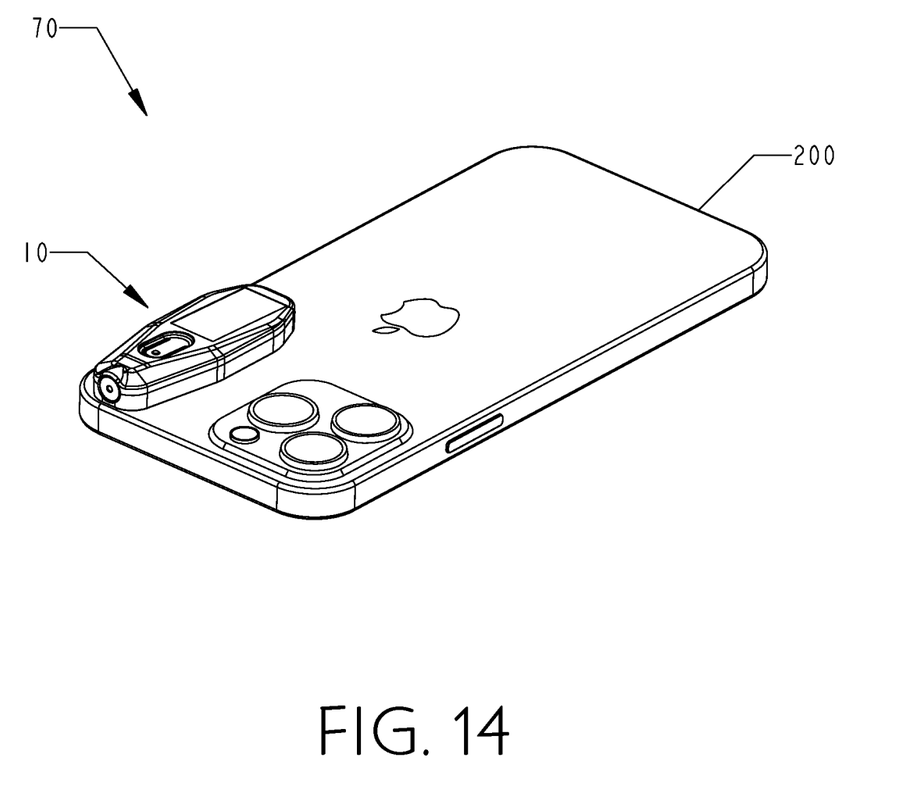
FIG. 14 illustrates a top perspective view of an alternative embodiment of the laser pointer accessory attached to an iPhone 13 Pro Max.
Figure 15:
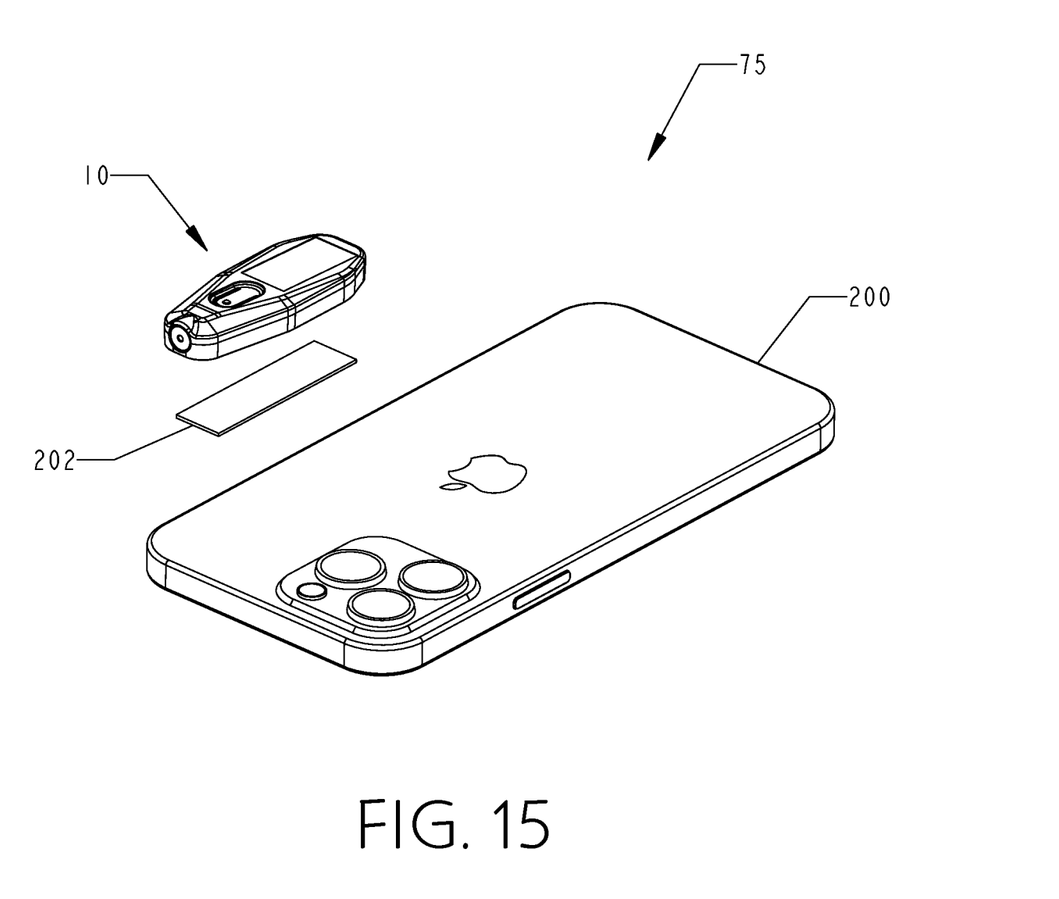
FIG. 15 illustrates a top perspective, partially exploded component view of the laser pointer accessory and iPhone 13 Pro Max of FIG. 14.

FIGS. 14 and 15 illustrate an alternative embodiment of the laser pointer accessory 10 attached to an iPhone 13 Pro Max. This embodiment has a larger flat, rectangular display surface where an indicia, such as a sticker, engraving or printed area may be disposed for aesthetic or promotional purposes. A coupling device 140, 202 may be used to attach the laser pointer accessory 10 to a smartphone 200 or to a smartphone cover 204.

Figure 16:
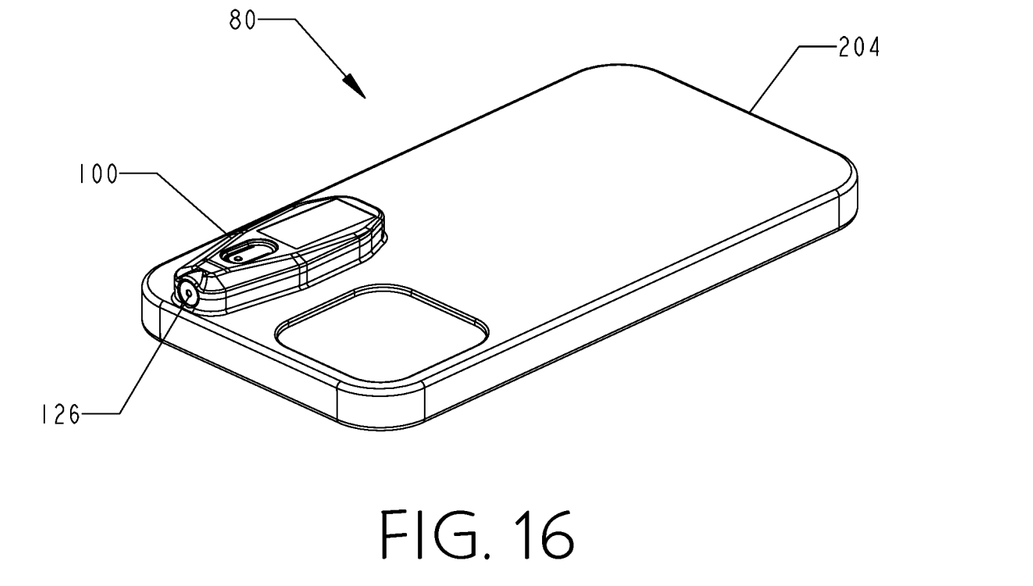
FIG. 16 illustrates a top, right perspective view of a laser pointer accessory integrated into a smartphone case.
Figure 17:
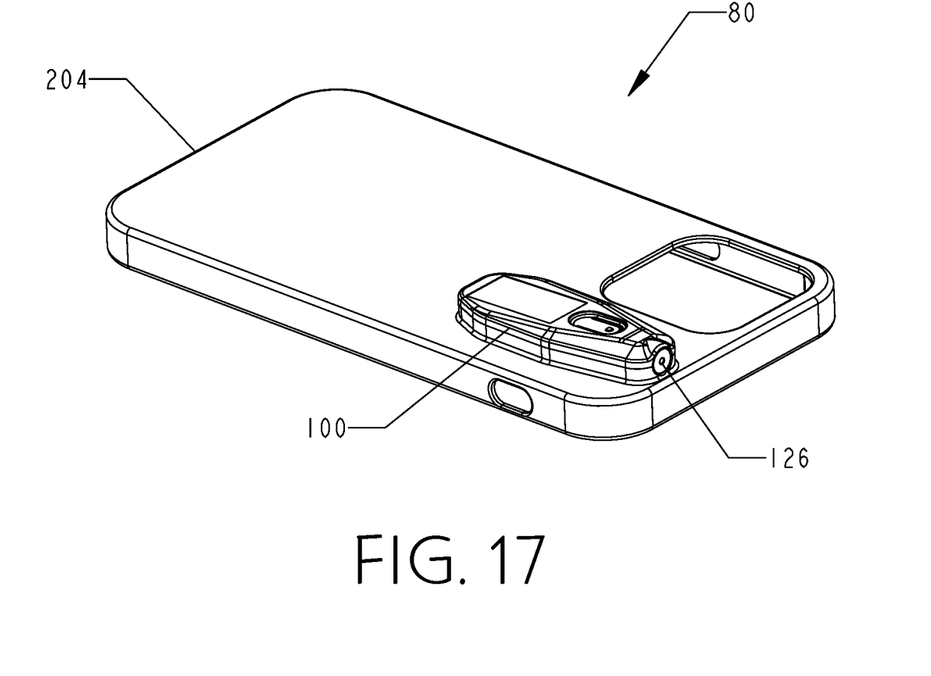
FIG. 17 illustrates a top, left perspective view of the laser pointer accessory integrated into a smartphone case of FIG. 16.
Figure 18:
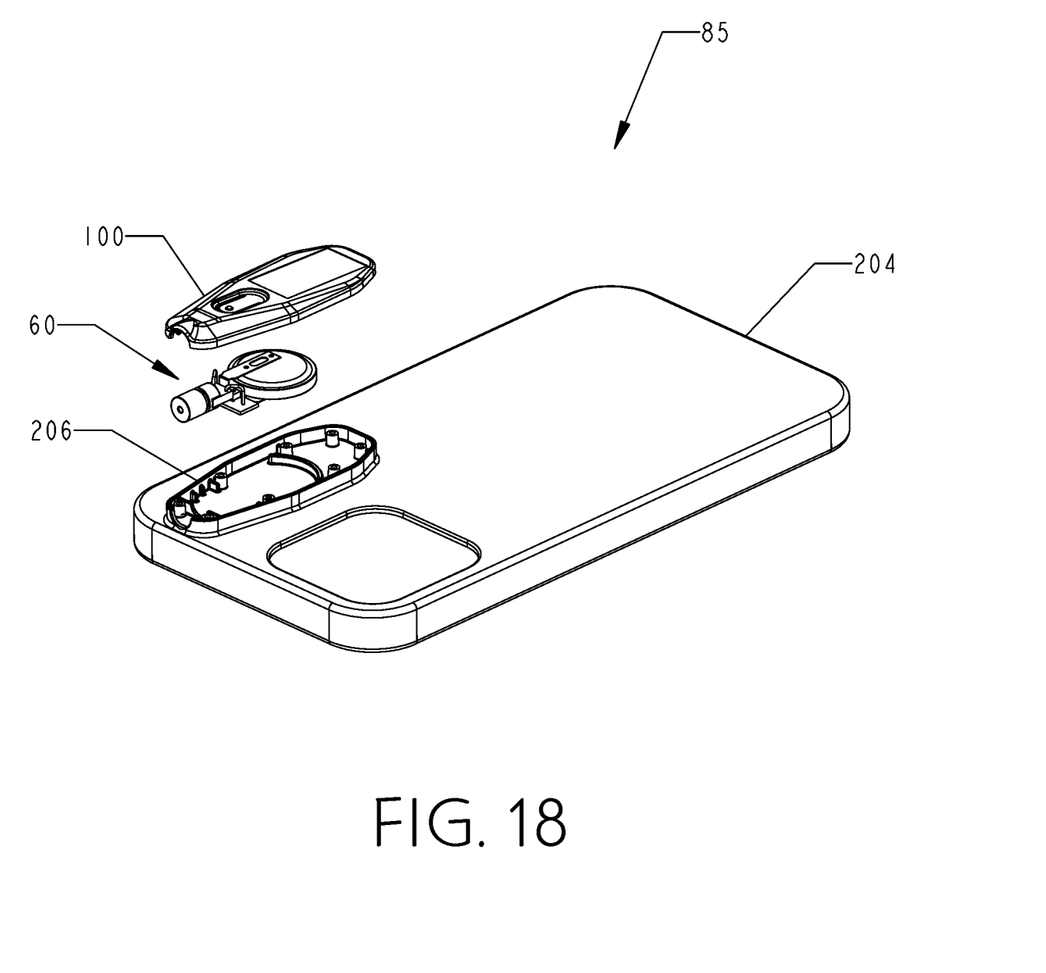
FIG. 18 illustrates a top, partially exploded view of the laser pointer accessory integrated into a smartphone case of FIG. 16.

FIG. 16-18 illustrate an embodiment of a laser pointer accessory integrated into a smartphone case. As shown in FIG. 18, lower housing 206 may be integrated into the smartphone case or cover 204. The lower housing 206 may be made from the same material as the cover 204 or with any other suitable material. The laser diode assembly 60 may be disposed within the base housing 206 and the upper housing 100 may be attached to same through adhesives, ultrasonic welding or any other suitable technique known now or to be developed. Alternatively in some embodiments the integrated base housing may be adapted to receive a complete laser pointer accessory 10, such as the ones depicted in FIGS. 1 & 15. The base housing 206 capable of connecting to a laser pointer accessory 10 may be integrally formed with a case or cover 204 or may be attached to the case or cover with a coupling device 140, 202.

Figure 19:
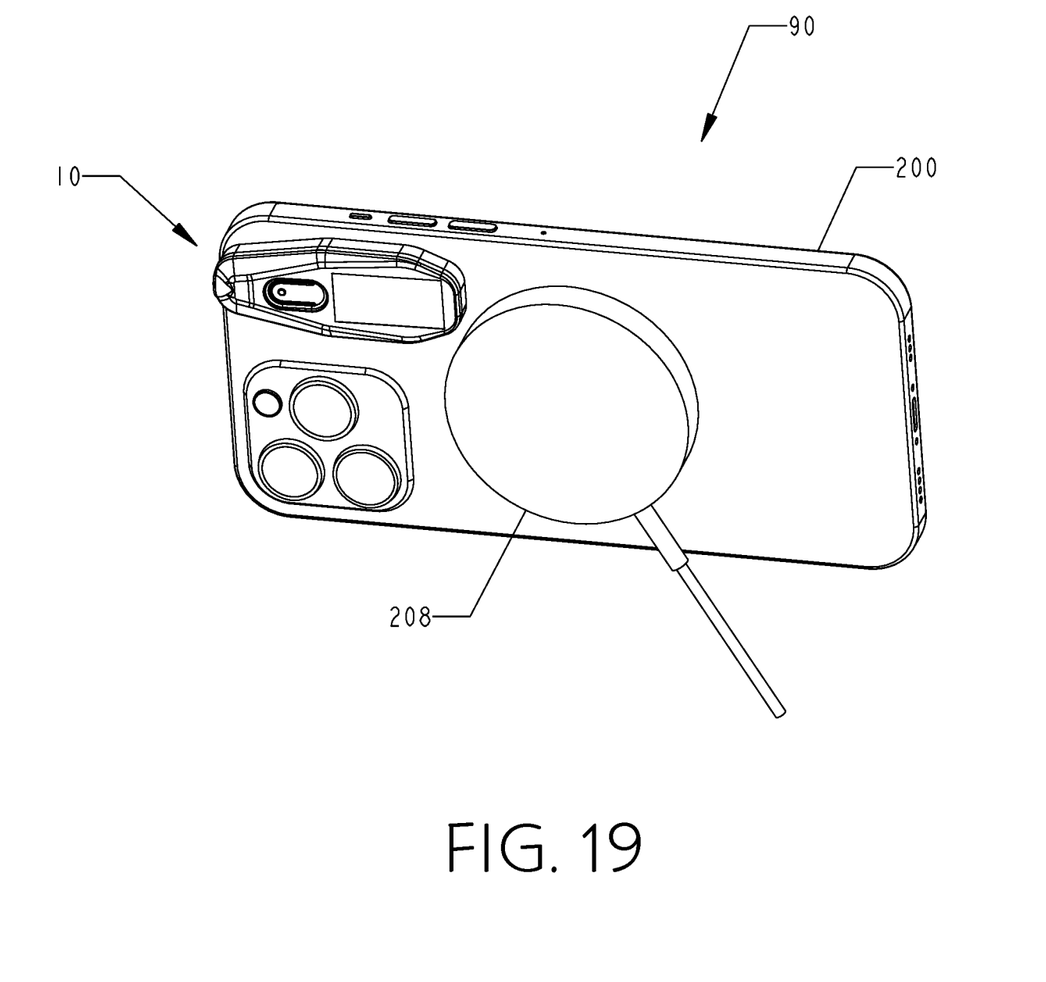
FIG. 19 illustrates a top perspective view of an alternative embodiment of an laser pointer accessory with wireless induction charging capabilities disposed on a smartphone that is being charged by a Qi standard wireless induction charger.

FIG. 19 illustrates a top perspective view of an alternative embodiment of a laser pointer accessory having wireless induction charging capabilities. Such embodiments of the laser pointer accessory 10 may be charged by connecting the attached smartphone to a wireless induction charger 208, such as a Qi standard MagSafe charger, or by directly connecting the laser pointer 10 accessory to the wireless induction charger 208.

Figure 20:
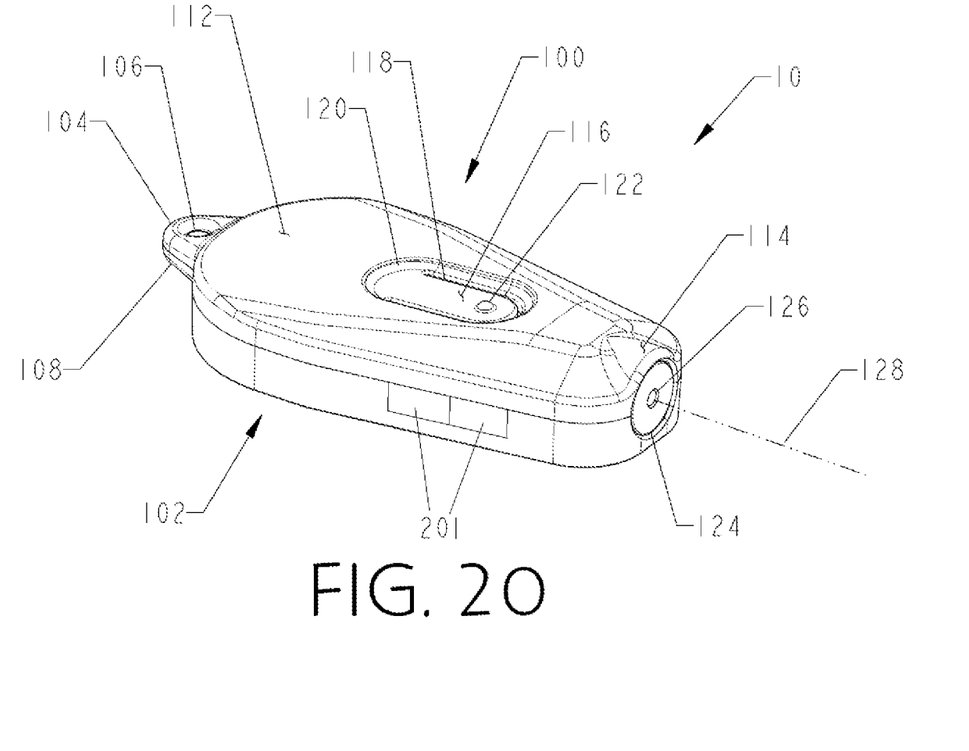
FIG. 20 illustrates a top, front perspective of a laser pointer accessory having input devices.

The laser pointer accessory 10 may be Bluetooth or other wireless protocol enabled, and may pair with a computing device, including a smartphone on which it is disposed, using same for unidirectional or bidirectional communication. The computing device can then provide instructions to the laser pointer accessory to vary the pattern, color or shape of the output laser light 28. As shown in FIG. 20 the laser pointer accessory 10 may be provided with one or more additional input devices 201 that, when paired with a computing device via Blue may provide input to the computing device. For example, the input devices 201 may both be buttons and a user may use the buttons to click back and forth between the slides of a presentation on the computing device. Any mouse button may be implemented in this manner including a click, a left button click, a right button click, or any other mouse button click. An input device 201 may be a scroll wheel or a spherical mouse input or multi-directional mouse bud, to replicate the functionality of mouse scroll wheel or mouse movement. As an alternative example, one of the input devices 201 may be a microphone and the other may be a button, such that the button activates the microphone and the sound captured is transmitted to the computing device via the wireless transmission protocol. Any suitable known or to be developed input devices may be included on the laser pointer accessory within the scope of the disclosed concepts. Such embodiments may be provided with a wireless communication transmitter that may be connected to the PCB, and may be provided with one or more input devices that can generate a signal to be transmitted through the wireless communication transmitter.

Persons of skill in the art will recognize that any of the features of the disclosed concepts may be implemented with any suitable laser pointer accessory independently or in conjunction with other features, within the scope of the disclosed concepts.

While specific embodiments have been discussed to illustrate the invention, it will be understood by those skilled in the art that the descriptions herein are intended as illustrative, and not as limiting, and that variations in the embodiments can be made without departing from the spirit of the invention. Accordingly, the foregoing descriptions are intended as illustrative, and not as limiting.

I claim:

1. A laser pointer accessory comprising:
a housing comprising a top and bottom surface, and an internal chamber;
a laser diode assembly disposed within the internal chamber of the housing, and comprising an actuation button;
wherein the top surface of the housing comprises an actuator capable of being depressed such that it engages the actuation button in order to activate the laser diode assembly.

2. The laser pointer accessory of claim 1 wherein the top surface of the housing comprises a recessed portion, and the actuator is disposed within the recessed portion such that the actuator is recessed relative to a plane defined by the top surface of the housing.

3. The laser pointer accessory of claim 2 wherein the actuator comprises a cantilever.

4. The laser pointer accessory of claim 3 wherein the cantilever comprises a cantilever bud.

5. The laser pointer accessory of claim 4 wherein the cantilever bud projects from a top surface of the cantilever, but remains beneath the plane defined by the top surface of the housing.

6. The laser pointer accessory of claim 3 wherein cantilever cutouts are provided around the cantilever.

7. The laser pointer accessory of claim 6 wherein a membrane capable of preventing liquids from entering the internal chamber of the housing is disposed at the cantilever and cantilever cutouts.

8. The laser pointer accessory of claim 1, further comprising a coupling device capable of detachably connecting the laser pointer assembly to a smartphone device.

9. The laser pointer accessory of claim 8, wherein the lower surface of the housing is provided with a recess, and the coupling device is disposed within the recess.

10. The laser pointer accessory of claim 8 wherein the coupling device is an adhesive.

11. The laser pointer accessory of claim 8 wherein the coupling device is a hook and loop system.

12. The laser pointer device of claim 8 wherein the coupling device is a command strip.

13. The laser pointer accessory of claim 1 further comprising a wireless communication transmitter, and a first input device capable generate a signal to be transmitted through the wireless communication transmitter.

14. The laser pointer accessory of claim 13 wherein the housing comprises an upper housing and a lower housing, and the laser diode assembly comprises a battery and the upper housing comprises a battery securing rib such that the battery securing rib secures the battery in place within the internal chamber of the housing.

15. The laser pointer accessory of claim 1 wherein the top surface comprises a display surface.

16. The laser pointer assembly of claim 1 wherein the housing further comprises a key ring feature.

17. The laser pointer assembly of claim 1 wherein the housing is capable of engaging with and being secured within a base housing.

18. The laser pointer assembly of claim 1 further comprising a base housing capable of connecting to a smartphone or smartphone case or cover, wherein the housing is capable of engaging with and being secured within a base housing.

19. A case for a smartphone comprising:
a protective housing capable of receiving and securing a smartphone;
a base housing integrally formed with the protective housing;
an upper housing comprising a top surface, the upper housing and the base housing forming an internal chamber;
a laser diode assembly disposed within the internal chamber of the housing, and comprising an actuation button;
wherein the top surface of the housing comprises an actuator capable of being depressed such that it engages the actuation button in order to activate the laser diode assembly.

20. A case for a smartphone comprising:
a protective housing capable of receiving and securing a smartphone;

a base housing integrally formed with the protective housing; and a laser pointer accessory comprising:

a housing comprising a top and bottom surface, and an internal chamber;

a laser diode assembly disposed within the internal chamber of the housing, and comprising an actuation button;

wherein the top surface of the housing comprises an actuator capable of being depressed such that it engages the actuation button in order to activate the laser diode assembly.

* * * * *